United States Patent
Lee et al.

(10) Patent No.: US 8,258,064 B2
(45) Date of Patent: Sep. 4, 2012

(54) METHODS OF FORMING A METAL SILICATE LAYER AND METHODS OF FABRICATING A SEMICONDUCTOR DEVICE INCLUDING THE METAL SILICATE LAYER

(75) Inventors: Jong-cheol Lee, Seoul (KR); Ki-yeon Park, Hwaseong-si (KR); Se-hoon Oh, Daejeon (KR); Youn-soo Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/909,947

(22) Filed: Oct. 22, 2010

(65) Prior Publication Data

US 2011/0104907 A1   May 5, 2011

(30) Foreign Application Priority Data

Oct. 29, 2009   (KR) .................. 10-2009-0103565

(51) Int. Cl.
*H01L 21/31*   (2006.01)
*H01L 21/283*   (2006.01)

(52) U.S. Cl. .................... 438/778; 257/E21.159

(58) Field of Classification Search ................ 438/778
See application file for complete search history.

(56) References Cited

U.S. PATENT DOCUMENTS

| | | | |
|---|---|---|---|
| 7,425,761 B2 * | 9/2008 | Choi et al. | 257/701 |
| 2005/0249876 A1 * | 11/2005 | Kawahara et al. | 427/255.34 |
| 2006/0228888 A1 | 10/2006 | Lee et al. | |
| 2007/0059895 A1 * | 3/2007 | Im et al. | 438/396 |
| 2008/0020593 A1 | 1/2008 | Wang et al. | |
| 2008/0044569 A1 * | 2/2008 | Myo et al. | 427/248.1 |
| 2008/0057690 A1 * | 3/2008 | Forbes et al. | 438/593 |
| 2008/0057737 A1 * | 3/2008 | Metzner et al. | 438/763 |
| 2011/0039419 A1 * | 2/2011 | Date et al. | 438/763 |

FOREIGN PATENT DOCUMENTS

JP   2003-204061   7/2003

* cited by examiner

*Primary Examiner* — William D Coleman
*Assistant Examiner* — Christine Enad
(74) *Attorney, Agent, or Firm* — Harness, Dickey & Pierce, P.L.C.

(57) ABSTRACT

Methods of forming a metal silicate layer and methods of fabricating a semiconductor device including the metal silicate layer are provided, the methods of forming the metal silicate layer include forming the metal silicate using a plurality of silicon precursors. The silicon precursors are homoleptic silicon precursors in which ligands bound to silicon have the same molecular structure.

22 Claims, 16 Drawing Sheets

(a) $t_5(s_5)$ = THIRTY SECONDS
0                                    90

(b) $t_5(s_5)$ = TWO SECONDS | $t_5'(s_5)$ = THIRTY SECONDS
0           20                        90

(c) $t_5(s_5)$ = TWO SECONDS | $t_5'(s_5)$ = THIRTY SECONDS
0                              70     90

METHODS OF FORMING A METAL SILICATE LAYER AND METHODS OF FABRICATING A SEMICONDUCTOR DEVICE INCLUDING THE METAL SILICATE LAYER

CROSS-REFERENCE TO RELATED APPLICATIONS

This application claims the benefit of priority under 35 U.S.C. §119 from Korean Patent Application No. 10-2009-0103565, filed on Oct. 29, 2009, in the Korean Intellectual Property Office, the disclosure of which is incorporated herein in its entirety by reference.

BACKGROUND

1. Field

Example embodiments of the inventive concepts relate to methods of forming a metal silicate layer and methods of fabricating a semiconductor device including the metal silicate layer, and more particularly, to methods of forming a metal silicate layer according to atomic layer deposition (ALD) using a silicon precursor, methods of forming a gate for a transistor including the metal silicate layer, and methods of forming a capacitor.

2. Description of the Related Art

An insulating layer having a high dielectric constant and stable leakage current characteristics is needed to fabricate a semiconductor device. To this end, a metal silicate layer, for example, is used. However, the smaller the size of an integration circuit, the more difficult to manufacture a metal silicate layer.

SUMMARY

Example embodiments of the inventive concepts relate to methods of forming a metal silicate layer and methods of fabricating a semiconductor device including the metal silicate layer, and more particularly, to methods of forming a metal silicate layer according to atomic layer deposition (ALD) using a silicon precursor, methods of forming a gate for a transistor including the metal silicate layer, and methods of forming a capacitor.

Example embodiments of the inventive concepts provide methods of forming a metal silicate layer having a high dielectric constant and stable leakage current characteristics. Example embodiments of the inventive concepts also provide methods of forming a gate for a transistor by using such a metal silicate layer. Example embodiments of the inventive concepts also provide methods of forming a capacitor by using such a metal silicate layer.

According to example embodiments of the inventive concepts, there is provided a method of fabricating a metal silicate layer. In the method, a silicon precursor is used. The silicon precursor is a homoleptic silicon precursor in which all ligands bound to silicon have the same molecular structure.

In the method, the silicon precursor may be a homoleptic silicon precursor, in which ligands bound to silicon have the same molecular structure and the ligands are symmetrically bound to silicon.

The homoleptic silicon precursors may be $Si(OC_2H_5)_4$. The homoleptic silicon precursors may be $Si(NCO)_4$. The homoleptic silicon precursors may be $SiCl_4$. The homoleptic silicon precursors may be $Si[N(CH_3)_2]_4$.

The homoleptic silicon precursors may include silicon and carbon. The homoleptic silicon precursors may include silicon, carbon and hydrogen. The homoleptic silicon precursors may include silicon, carbon and nitrogen.

The metal may be at least one selected from the group consisting of quadrivalent metal, rare earth elements, trivalent metal, divalent metal, pentavalent metal and combinations thereof.

The method may be an atomic layer deposition method, in which (a) a silicon oxide layer is formed on a substrate by injecting the homoleptic silicon precursors on the substrate, (b) a metal oxide layer is formed on the silicon oxide layer, (c) a multi-level layer is formed on the substrate by performing the forming of the silicon oxide layer and the forming of the metal oxide layer n times (where the multi-level layer includes n stacked structures in which the metal oxide layer is formed on the silicon oxide layer, and n is a positive integer), and (d) the metal silicate layer is formed by thermally processing the multi-level layer.

The method may be an atomic layer deposition method, in which (a) a metal oxide layer is formed on a substrate, (b) a silicon oxide layer is formed on the metal oxide layer by injecting the homoleptic silicon precursors on the metal oxide layer, (c) a multi-level layer is formed on the substrate by performing the forming of the metal oxide layer and the forming of the silicon oxide layer n times, (where the multi-level layer includes n stacked structures in which the silicon oxide layer is formed on the metal oxide layer, and n is a positive integer), and (d) the metal silicate layer is formed by thermally processing the multi-level layer.

The method may be an atomic layer deposition method, in which (a) some of a plurality of metal precursors are adsorbed on the substrate by injecting the metal precursors on a substrate, (b) remnant metal precursors that are not adsorbed on the substrate are purged, (c) some of the homoleptic silicon precursors are adsorbed on the adsorbed metal precursors by injecting the homoleptic silicon precursors on the adsorbed metal precursors, (d) remnant homoleptic silicon precursors that are not adsorbed on the metal precursors are purged, (e) a reactant gas is supplied so that the adsorbed homoleptic silicon precursors, the adsorbed metal precursors, and the reactant gas react with one another to form the metal silicate layer; and (f) purging a non-reacting portion of the reactant gas.

Operations (a) and (b) may be performed sequentially several times before operations (c) and (d) are performed. Operations (c) and (d) may be performed sequentially several times after operations (a) and (b) are performed. A unit cycle, which includes operations (a) to (f), may be performed repeatedly several times. That is, the atomic layer deposition method (i.e., operations (a) to (f)) is performed a number of times, y, where y is a positive integer equal to and greater than '2'. The atomic layer deposition process may include a first cycle in which the reactant gas is injected, and a second cycle performed after the first cycle. A time period for the first cycle may be shorter than that for the second cycle. The first cycle may be performed a number of times, k, where k is positive integer less than y.

The method may be an atomic layer deposition method, in which (a) some of the homoleptic silicon precursors are adsorbed on the substrate by injecting the homoleptic silicon precursors on the substrate, (b) remnant homoleptic silicon precursors that are not adsorbed on the substrate are purging, (c) some of the metal precursors are adsorbed on the adsorbed homoleptic silicon precursors by injecting the metal precursors on the adsorbed homoleptic silicon precursors, (d) remnant metal precursors that are not adsorbed on the homoleptic silicon precursors are purged, (e) a reactant gas is supplied so that the adsorbed metal precursors, the adsorbed homoleptic silicon precursors, and the reactant gas react with one another to form the metal silicate layer, and (f) a non-reacting portion of the reactant gas is purged.

Operations (a) and (b) may be performed sequentially several times before operations (c) and (d) are performed. Operations (c) and (d) may be performed sequentially several times after operations (a) and (b) are performed. A unit cycle, which includes operations (a) to (f), may be performed repeatedly several times. That is, the atomic layer deposition method (i.e., operations (a) to (f)) is performed a number of times, y, where y is a positive integer equal to and greater than '2'. The atomic layer deposition process may include a first cycle in which the reactant gas is injected, and a second cycle performed after the first cycle. A time period for the first cycle may be shorter than that for the second cycle. The first cycle may be performed a number of times, k, where k is positive integer less than y.

According to example embodiments of the inventive concepts, there is provided a method of fabricating a gate for a transistor. In the method, a metal silicate layer is formed according to the above method of forming a metal silicate layer, and a conductive layer is formed on the metal silicate layer. The metal silicate layer is formed as a dielectric of the gate for a transistor.

According to example embodiments of the inventive concepts, there is provided a method of fabricating a capacitor. In the method, a metal silicate layer is formed according to the above method of forming a metal silicate layer, and a conductive layer is formed on the metal silicate layer. The metal silicate layer is formed as a dielectric of the capacitor.

BRIEF DESCRIPTION OF THE DRAWINGS

Example embodiments of the inventive concepts will be more clearly understood from the following detailed description taken in conjunction with the accompanying drawings in which:

FIG. 14(a) to (c) each illustrate a time period in which a reactant gas is supplied in each of the cycles in which a metal silicate layer is formed according to example embodiments of the inventive concepts;

DETAILED DESCRIPTION OF EXAMPLE EMBODIMENTS

Figure 1:
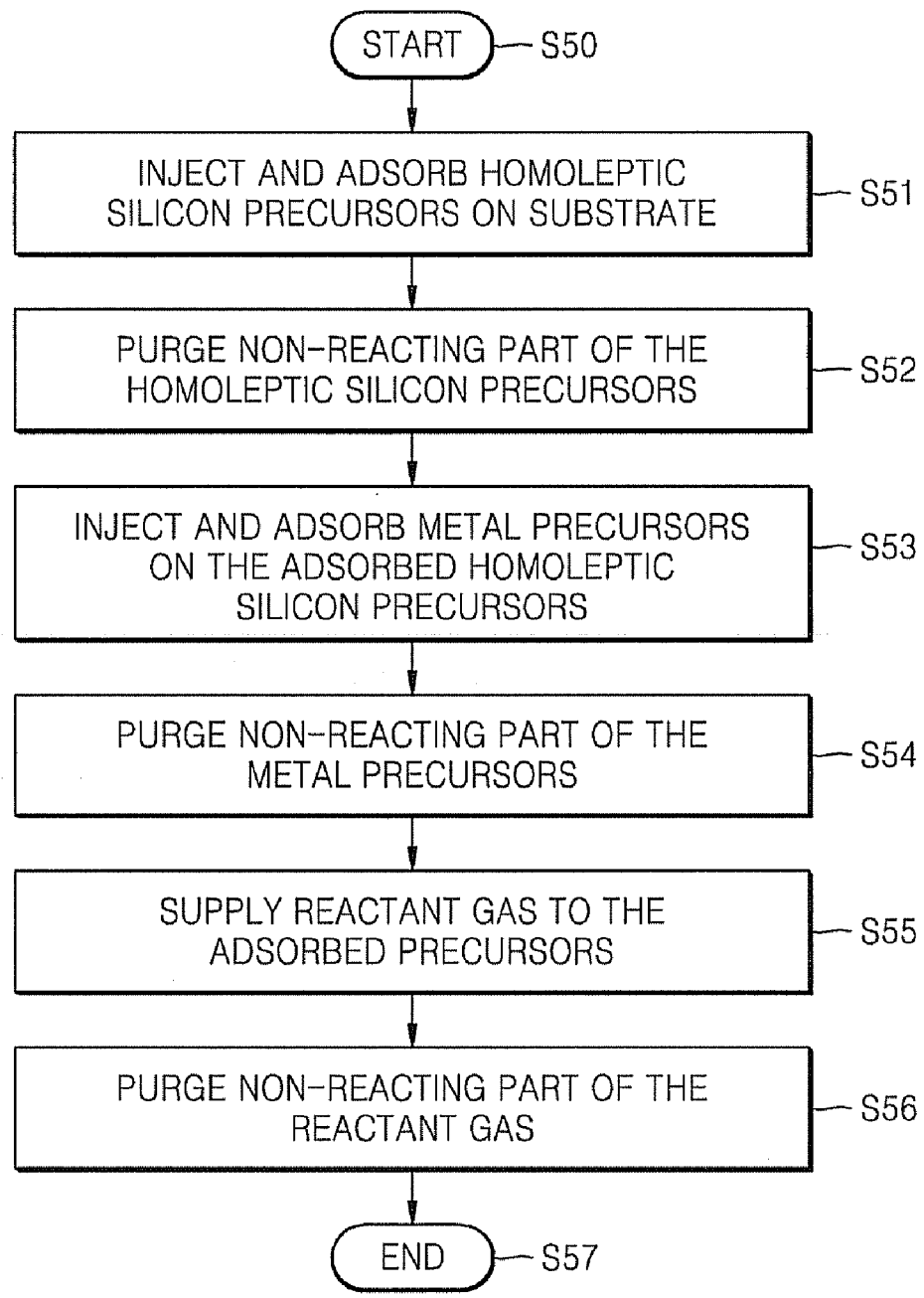
FIG. 1 is a flowchart illustrating a method of forming a metal silicate layer according to example embodiments of the inventive concepts.
Figure 2:
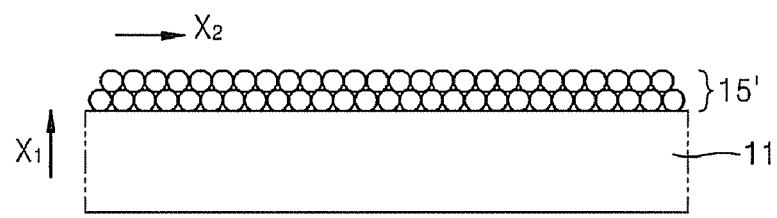
FIGS. 2 to 5 are cross-sectional views sequentially illustrating a method of forming a metal silicate layer according to example embodiments of the inventive concepts.
Figure 3:
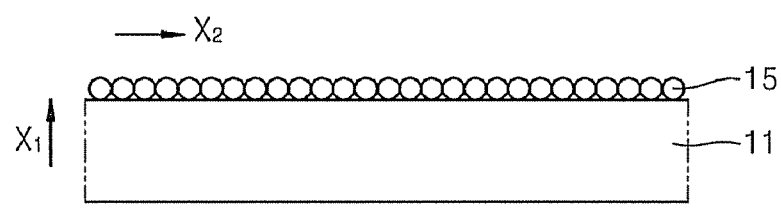
Figure 4:
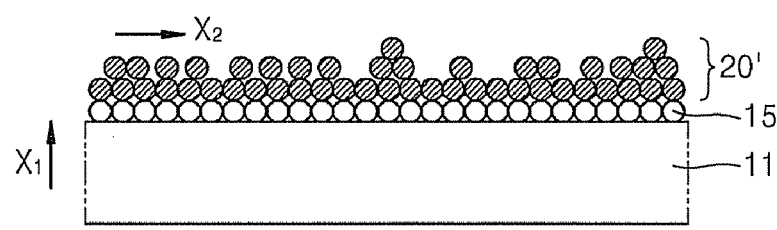
Figure 5:
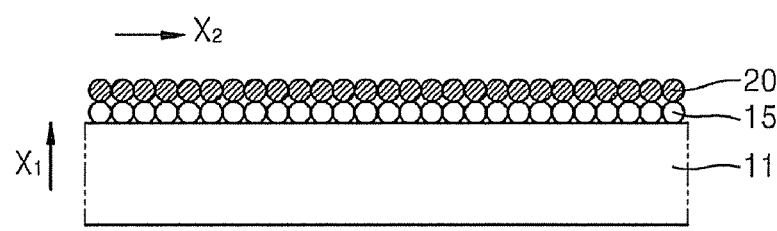

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures. In this disclosure, the term 'layer' is used to indicate a part of a structure manufactured by stacking elements thereon. Thus, this term should not be limited by the thicknesses of the elements.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can, be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

In this disclosure, a 'metal silicate layer' indicates a layer containing silicon, at least one metal, and oxygen. The metal silicate layer may be expressed as '$M_xSi_yO_z$', where M denotes at least one metal, and x, y, and z are positive real numbers. The at least one metal may be selected from the group consisting of a quadrivalent metal, a trivalent metal, a divalent metal, a pentavalent metal, rare earth elements and mixtures thereof. For example, the quadrivalent metal may contain zirconium (Zr), hafnium (Hf) or titanium (Ti). The trivalent metal may contain scandium (Sc), yttrium (Y), aluminum (Al), gallium (Ga) or indium (In). The bivalent metal may contain barium (Ba), strontium (Sr) or calcium (Ca). The pentavalent metal may contain niobium (Nb) or tantalum (Ta). The rare earth elements mean elements of atomic numbers 57 to 70.

Example embodiments of the inventive concepts relate to methods of forming a metal silicate layer and methods of fabricating a semiconductor device including the metal silicate layer, and more particularly, to methods of forming a metal silicate layer according to atomic layer deposition (ALD) using a silicon precursor, methods of forming a gate for a transistor including the metal silicate layer, and methods of forming a capacitor.

FIG. 1 is a flowchart illustrating a method of forming a metal silicate layer according to example embodiments of the inventive concepts. FIGS. 2 to 5 are cross-sectional views sequentially illustrating a method of forming a metal silicate layer according to example embodiments of the inventive concepts.

Referring to FIGS. 1 to 5, a plurality of homoleptic silicon precursors 15' are injected on a substrate 11 within a reaction space (not shown) (S51).

The reaction space denotes a space having volume in which conditions may be controlled to grow layers on the substrate 11. For example, the reaction space may be a reaction chamber that is installed in either a single wafer reactor, or in a batch reactor, where deposition is performed simultaneously on a plurality of substrates.

The substrate 11 is an object on which a metal silicate layer is to be deposited. In example embodiments, the substrate 11 indicates an object including a layer formed of an arbitrary material. For example, the substrate 11 may be an object including a layer formed of a conductive material, a semiconductive material, an insulating material or combinations thereof.

The homoleptic silicon precursors 15' are silicon precursors, in which ligands bound to silicon have the same molecular or atomic structure. A pair of electrons may be shared when molecules or atoms that act as the ligands are coordinate-covalent bound to silicon. The ligands may be symmetrically bound to silicon. That is, the ligands may be symmetrically arranged about silicon in a three-dimensional (3D) space or on a two-dimensional (2D) plane.

For example, the homoleptic silicon precursors 15' may be $Si(OC_2H_5)_4$. In this case, four ligands are bound to silicon and have the same molecular structure of $OC_2H_5$.

As another example, the homoleptic silicon precursors 15' may be $Si(NCO)_4$. In this case, four ligands are bound to silicon and have the same molecular structure of NCO.

As another example, the homoleptic silicon precursors 15' may be $Si[N(CH_3)_2]_4$. In this case, four ligands are bound to silicon and have the same molecular structure of $N(CH_3)_2$.

As another example, the homoleptic silicon precursors 15' may be $SiCl_4$. In this case, four ligands are bound to silicon and have the same atomic structure of chlorine (Cl).

Because, the same ligands are symmetrically bound to silicon in the homoleptic silicon precursors 15', the binding energies among silicon and the ligands are symmetrical with one another in the 3D space or on the 2D plane. The homoleptic silicon precursors 15' are expected to be evenly adsorbed to, bound to, or separated from a surface of the substrate 11. Accordingly, a silicon composition may be evenly distributed in a metal silicate layer which will be formed in a subsequent process.

After injection, some homoleptic silicon precursors 15 are adsorbed on the substrate 11 from among the homoleptic silicon precursors 15' injected on the substrate 11 (S51). The adsorption of the homoleptic silicon precursors 15 means that the molecules of the homoleptic silicon precursors 15 are physically and/or chemically attached to a surface of the substrate 11.

Remnant homoleptic silicon precursors 15' (of the injected homoleptic silicon precursors 15') that are not adsorbed on or do not react with the substrate 11 are purged with an inert gas (e.g., nitrogen ($N_2$), helium (He) or argon (Ar)) (S52). After the purging, only the adsorbed homoleptic silicon precursors 15 are present on the substrate 11.

A plurality of metal precursors 20' are injected on the adsorbed homoleptic silicon precursors 15 (S53).

The metal precursors 20' may be hafnium precursors formed of a material selected from the group consisting of $Hf[N(CH_3)_2]_4$, $Hf[N(CH_3)(C_2H_5)]_4$, $Hf[N(C_2H_5)_2]_4$, $Hf(Ot-C_4H_9)_4$, $Hf(BH_4)_4$, $Hf(Cp)[N(CH_3)_2]_3$, $Hf(CH_3Cp)[N(CH_3)_2]_3$, $Hf(C_2H_5Cp)[N(CH_3O_2)_3$, $Hf(Cp)[N(CH_3(C_2H_5)]_3$ and mixtures thereof.

Alternatively, the metal precursors 20' may be zirconium precursors formed of a material selected from the group consisting of $Zr[N(CH_3)_2]_4$, $Zr[N(CH_3)(C_2H_5)]_4$, $Zr[N(C_2H_5)_2]_4$, $Zr(Ot-C_4H_9)_4$, $Zr(BH_4)_4$ and mixtures thereof.

Alternatively, the metal precursors 20' may be titanium (Ti) precursors, tantalum (Ta) precursors, ruthenium (Ru) precursors and mixtures thereof.

However, the type and chemical composition of the metal precursors 20' according to example embodiments are not limited to the above description and various types of metal precursors known to those of ordinary skill in the art may be used.

Metal precursors 20 are adsorbed on the substrate 11 and/or the homoleptic silicon precursors 15 from among the metal precursors 20' (S53).

The remnant metal precursors 20' that are not adsorbed on or do not react with the substrate 11 and/or the homoleptic silicon precursors 15 are purged with an inert gas (e.g., $N_2$, He or Ar) (S54). After the purging, the adsorbed homoleptic silicon precursors 15 and the adsorbed metal precursors 20 are present on the substrate 11.

A reactant gas is supplied to the reaction space so that the reactant gas may react with the adsorbed metal precursors 20 and the adsorbed homoleptic silicon precursors 15 to form a metal silicate layer on the substrate 11 (S55). The reactant gas may be selected from the group consisting of materials obtained by plasma-exciting water, ozone ($O_3$), oxygen ($O_2$) and combinations thereof. A portion of the reactant gas that does not react with the adsorbed metal precursors 20 and the adsorbed homoleptic silicon precursor 15 is purged with an inert gas (e.g., $N_2$, He or Ar) (S56).

A direction, in which the homoleptic silicon precursors 15', the metal precursors 20', and the reactant gas described above with reference to FIGS. 2 to 5 are injected into the reaction space, may be either a direction X2 parallel to or a direction X1 perpendicular to the surface of the substrate 11 on which the metal silicate layer is formed.

If the homoleptic silicon precursors 15', the metal precursors 20', and the reactant gas are injected into the reaction space in the perpendicular direction X1, then they are diffused along the parallel direction X2 and are thus adsorbed to, bound to, or separated from the surface of the substrate 11, thereby forming the metal silicate layer.

In the homoleptic silicon precursors 15', the binding energies among the silicon and the ligands are symmetrical with one another in a 3D space or on a 2D plane because the same ligands are symmetrically bound to silicon. The homoleptic silicon precursors 15' are expected to be evenly adsorbed on, bound to, or separated from the substrate 11 in the parallel direction X2. As such, the silicon composition may be evenly distributed in the metal silicate layer formed in a subsequent process.

The metal silicate layer described with reference to FIGS. 2 to 5 may be formed according to atomic layer deposition (ALD). In the ALD, a plurality of precursors are injected into a reaction space in order to adsorb the precursors to a substrate to a thickness similar to that of an atomic layer. The adsorbed precursors are purged, and subsequently a reactant gas is injected into the reaction space, thereby forming a thin layer. In the drawings of this disclosure, a single atomic layer is adsorbed on a substrate for convenience of explanation but example embodiments of the inventive concepts are not limited thereto. A plurality of atomic layers may be adsorbed on the substrate.

Figure 6:
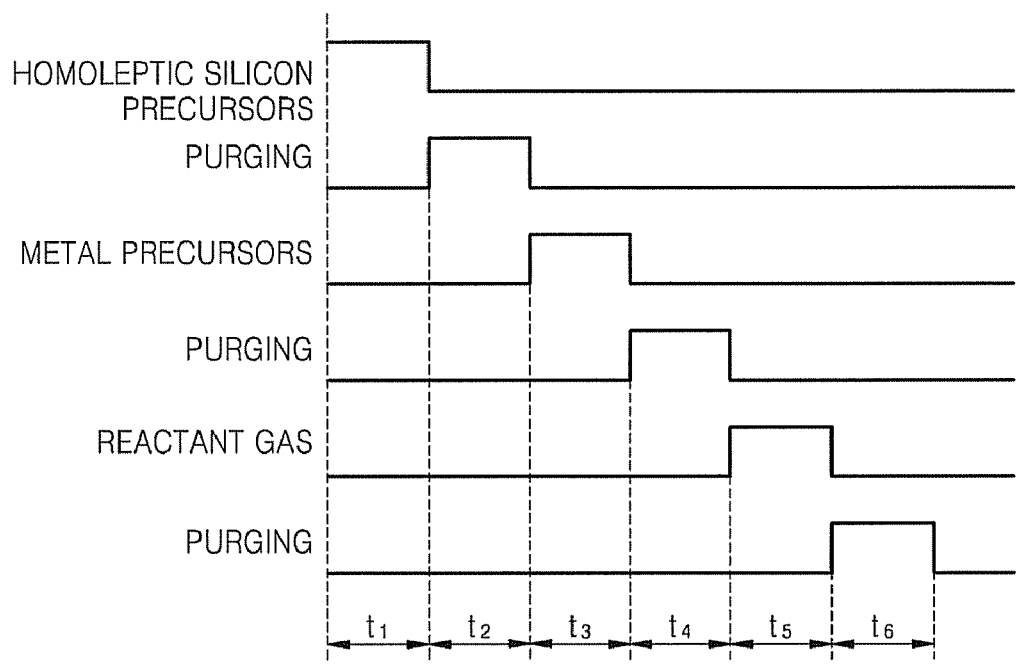
FIG. 6 is a timing diagram of a cycle in which a metal silicate layer is formed according to example embodiments of the inventive concepts.

FIG. 6 is a timing diagram of a cycle in which a metal silicate layer is formed according to example embodiments of the inventive concepts.

Referring to FIG. 6, a plurality of homoleptic silicon precursors are injected in a reaction space in first time period t1. An inert gas is injected in the reaction space in order to purge non-reacting homoleptic silicon precursors of the injected homoleptic silicon precursors in a second time period t2. A plurality of metal precursors are injected in the reaction space in a third time period t3. An inert gas is injected in the reaction space in order to purge non-reacting metal precursors from among the plurality of injected metal precursors in a fourth time period t4. A reactant gas is injected in the reaction space in a fifth time period t5. A non-reacting portion of the reactant gas is purged in a sixth time period t6.

Alternatively, injecting a plurality of homoleptic silicon precursors (first time period t1) and injecting an inert gas in order to purge non-reacting homoleptic silicon precursors of the injected homoleptic silicon precursors (second time period t2) may be performed repeatedly and sequentially before injecting a plurality of metal precursors (third time period t3) and injecting an inert gas in order to purge non-reacting metal precursors of the injected metal precursors (fourth time period t4). For example, the homoleptic silicon precursors may be injected, and then the inert gas may be sequentially injected. The alternating injections may be performed repeatedly and sequentially.

Alternatively, injecting a plurality of metal precursors (third time period t3) and injecting an inert gas in order to purge non-reacting metal precursors of the injected metal precursors (fourth time period t4) may be performed repeatedly and sequentially after injecting a plurality of homoleptic silicon precursors (first time period t1) and injecting an inert gas in order to purge non-reacting homoleptic silicon precursors of the injected homoleptic silicon precursors (second time period t2).

Alternatively, a unit cycle may be performed repeatedly. The unit cycle includes injecting a plurality of homoleptic silicon precursors (first time period t1), injecting an inert gas in order to purge non-reacting homoleptic silicon precursors of the injected homoleptic silicon precursors (second time period t2), injecting a plurality of metal precursors (third time period t3), injecting an inert gas in order to purge non-reacting metal precursors of the injected metal precursors (fourth time period t4), injecting a reactant gas (fifth time period t5), and purging a non-reacting portion of the reactant gas (sixth time period t6).

Figure 7:
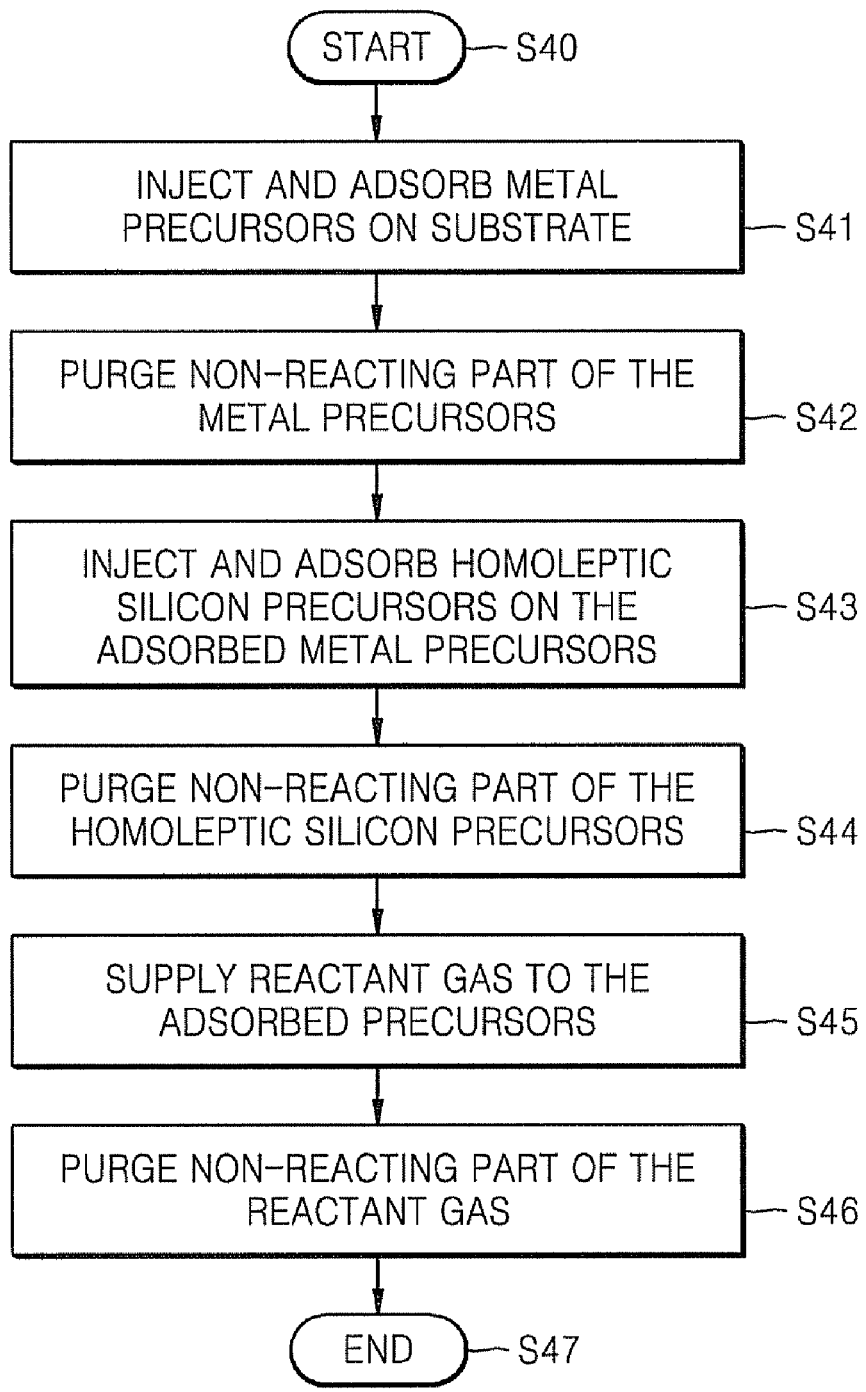
FIG. 7 is a flowchart illustrating a method of forming a metal silicate layer according to example embodiments of the inventive concepts.
Figure 8:
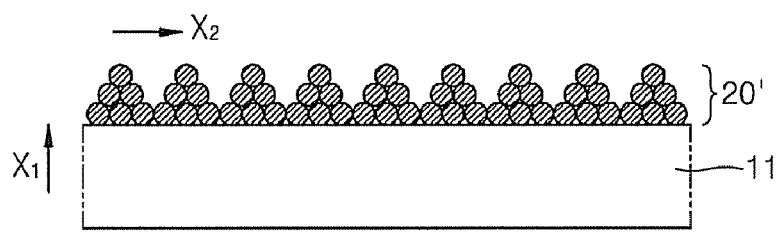
FIGS. 8 to 11 are cross-sectional views sequentially illustrating a method of forming a metal silicate layer according to example embodiments of the inventive concepts.
Figure 9:
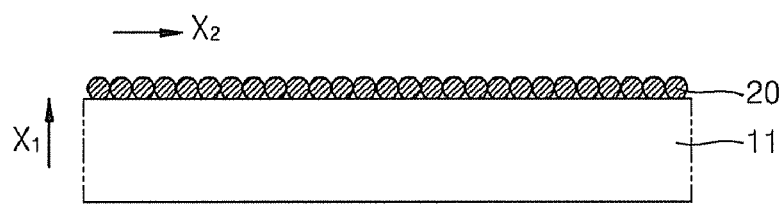
Figure 10:
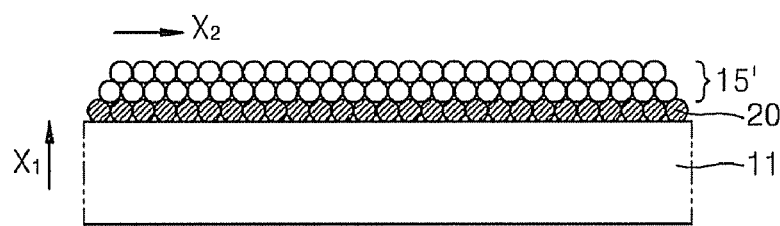
Figure 11:
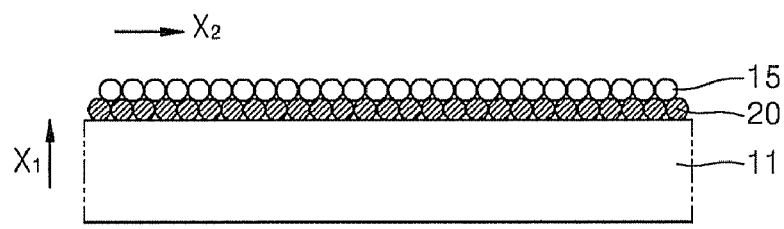

FIG. 7 is a flowchart illustrating a method of forming a metal silicate layer according to example embodiments of the inventive concepts. FIGS. 8 to 11 are cross-sectional views sequentially illustrating a method of forming a metal silicate layer according to example embodiments of the inventive concepts.

Referring to FIGS. 7 to 11, a plurality of metal precursors 20' are injected on a substrate 11 within a reaction space (not shown) (S41).

The reaction space denotes a space having a volume in which conditions may be controlled to grow layers on the substrate 11. For example, the reaction space may be a reaction chamber that is installed in either a single wafer reactor or in a batch reactor where deposition is performed simultaneously on a plurality of substrates.

The substrate 11 is an object on which a metal silicate layer is to be deposited. In example embodiments, the substrate 11 indicates an object including a layer formed of an arbitrary material. For example, the substrate 11 may be an object including a layer formed of a conductive material, a semi-conductive material, an insulating material or a combination thereof.

The type and chemical composition of the metal precursors 20' are as described above with reference to FIGS. 1 to 5.

Metal precursors 20 are adsorbed on the substrate 11 from among the injected metal precursors 20' (S41). The adsorption of the metal precursors 20 means that the molecules of the metal precursors 20' are adhered physically and/or chemically to a surface of the substrate 11. The metal precursors 20 may be chemically adsorbed to the surface of the substrate 11. Hereinafter, the term, 'absorption' is understood as described above.

Remnant metal precursors 20' that are not adsorbed on or do not react with the substrate 11 are purged with an inert gas (e.g., $N_2$, He, or Ar) (S42). After the purging, only the adsorbed metal precursors 20 are present on the substrate 11.

A plurality of homoleptic silicon precursors 15' are adsorbed on the metal precursors 20 (S43).

The homoleptic silicon precursors 15' are silicon precursors, in which ligands bound to silicon have the same molecular or atomic structure. A pair of electrons may be shared when molecules or atoms that act as the ligands are coordinate-covalent bound to silicon. The ligands may be symmetrically bound to silicon. That is, the ligands may be symmetrically arranged about silicon in a 3D space or on a 2D plane.

For example, the homoleptic silicon precursors 15' may be $Si(OC_2H_5)_4$. In this case, four ligands are bound to silicon and have the same molecular structure of $OC_2H_5$.

As another example, the homoleptic silicon precursors 15' may be $Si(NCO)_4$. In this case, four ligands are bound to silicon and have the same molecular structure of NCO.

As another example, the homoleptic silicon precursors 15' may be $Si[N(CH_3)_2]_4$. In this case, four ligands are bound to silicon and have the same molecular structure of $N(CH_3)_2$.

As another example, the homoleptic silicon precursors 15' may be $SiCl_4$. In this case, four ligands are bound to silicon and have the same atomic structure of chlorine (Cl).

Because the same ligands are symmetrically bound to silicon in the homoleptic silicon precursors 15', the binding energies among silicon and the ligands are symmetrical with one another in the 3D space or on the 2D plane. The homoleptic silicon precursors 15' are expected to be evenly adsorbed to, bound to, or separated from the surface of the substrate 11. As such, a silicon composition may be evenly distributed in a metal silicate layer which will be formed in a subsequent process.

Homoleptic silicon precursors 15 are adsorbed on the substrate 11 and/or the metal precursors 20 from among the adsorbed metal precursors 20 (S43). The adsorption of the homoleptic silicon precursors 15 means that the molecules of the homoleptic silicon precursors 15 are adhered physically and/or chemically to the surface of the substrate 11 and/or surfaces of the metal precursors 20.

Remnant homoleptic silicon precursors 15' that are not adsorbed on or do not react with the surface of the substrate 11 and/or the surfaces of the metal precursors 20 are purged with an inert gas (e.g., $N_2$, He or Ar) (S44). After the purging, only the adsorbed metal precursors 20 and the adsorbed homoleptic silicon precursors 15 are present on the surface 11.

A reactant gas is supplied in the reaction space so that the adsorbed metal precursors 20, the adsorbed homoleptic silicon precursors 15, and the reactant gas may react with one another to form a metal silicate layer on the substrate 11 (S45). The reactant gas has been described above with reference to FIGS. 1 to 5.

A non-reacting portion of the reactant gas supplied to the reaction space is purged with an inert gas (e.g., $N_2$, He, or Ar) (S46).

A direction in which the homoleptic silicon precursors 15', the metal precursors 20', and the reactant gas described above with reference to FIGS. 8 to 11 are injected into the reaction space, may be either a direction X2 parallel to, or a direction X1 perpendicular to, the surface of the substrate 11 on which the metal silicate layer is formed.

If the homoleptic silicon precursors 15', the metal precursors 20', and the reactant gas are injected into the reaction space in the perpendicular direction X1, then they are diffused along the parallel direction X2 and are thus adsorbed to, bound to, or separated from the surface of the substrate 11, thereby forming the metal silicate layer.

In the homoleptic silicon precursors 15', the binding energies among the silicon and the ligands are symmetrical with one another in a 3D space or on a 2D plane because the same ligands are symmetrically bound to silicon. The homoleptic silicon precursors 15' are expected to be evenly adsorbed on, bound to, or separated from the substrate 11 in the parallel direction X2. As such, a silicon composition may be evenly distributed in the metal silicate layer formed in a subsequent process.

The metal silicate layer described with reference to FIGS. 8 to 11 may be formed according to atomic layer deposition (ALD), which has been described above with reference to FIGS. 1 to 5.

Figure 12:
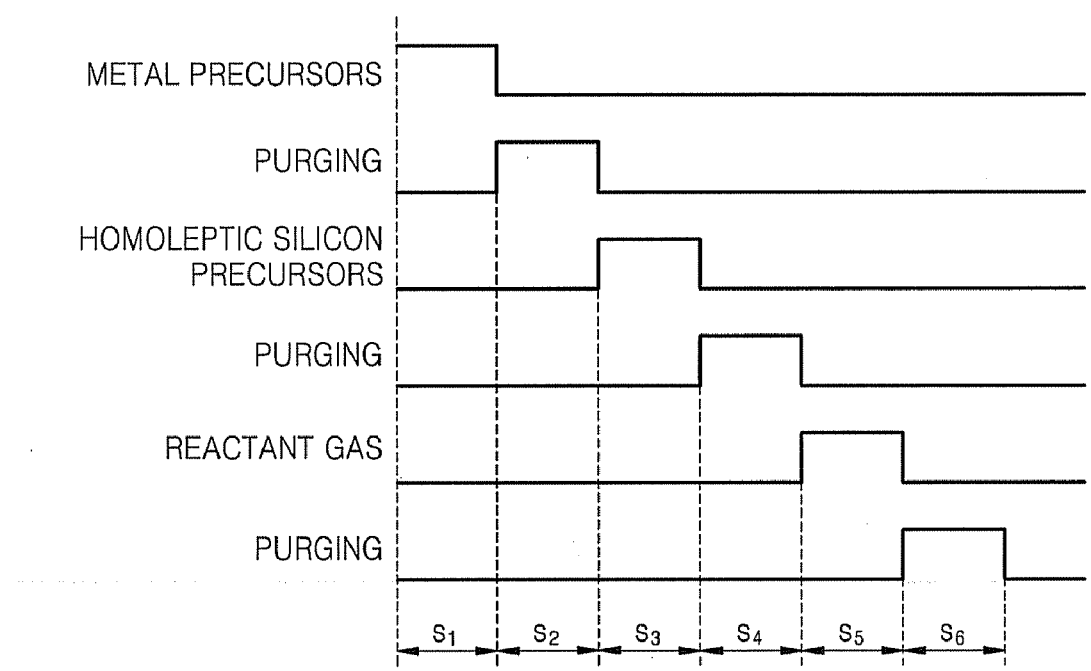
FIG. 12 is a timing diagram of a cycle in which a metal silicate layer is formed according to example embodiments of the inventive concepts.

FIG. 12 is a timing diagram of a cycle in which a metal silicate layer is formed according to example embodiments of the inventive concepts.

Referring to FIG. 12, a plurality of metal precursors are injected in a reaction space in a first time period s1. An inert gas is injected to purge non-reacting metal precursors of the injected metal precursors in a second time period s2. A plurality of homoleptic silicon precursors are injected in a third time period s3. An inert gas is injected to purge non-reacting homoleptic silicon precursors of the injected homoleptic silicon precursors in a fourth time period s4. A reactant gas is injected in a fifth time period s5. A non-reacting portion of the reactant gas is purged in a sixth time period s6.

Alternatively, injecting a plurality of metal precursors (first time period s1) and injecting an inert gas to purge a non-reacting part of the metal precursors (second time period s2) may be repeatedly and sequentially performed before injecting a plurality of metal precursors (third time period s3) and injecting an inert gas to purge non-reacting homoleptic silicon precursors of the injected homoleptic silicon precursors (fourth time period s4).

Alternatively, injecting a plurality of metal precursors (third time period s3) and injecting an inert gas to purge non-reacting homoleptic silicon precursors of the injected homoleptic silicon precursors (fourth time period s4) may be repeatedly and sequentially performed before injecting a plurality of metal precursors (first time period s1) and injecting an inert gas to purge non-reacting metal precursors of the injected metal precursors (second time, period s2).

Alternatively, a unit cycle may be repeatedly performed. The unit cycle includes injecting a plurality of metal precursors (first time period s1), injecting an inert gas to purge non-reacting metal precursors of the injected metal precursors (second time period s2), injecting a plurality of metal precursors (third time period s3), injecting an inert gas to purge non-reacting homoleptic silicon precursors of the injected homoleptic silicon precursors (fourth time period s4), injecting a reactant gas (fifth time period s5), and purging a non-reacting portion of the reactant gas (sixth time period s6).

Figures 13, 14:
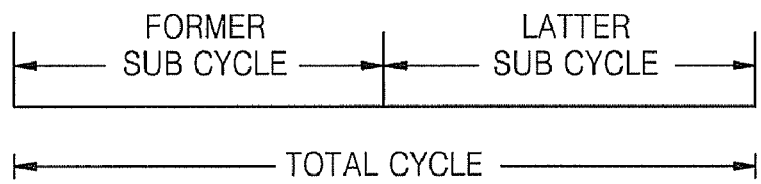
FIG. 13 is illustrates a cycle in which a metal silicate layer is formed according to example embodiments of the inventive concepts.

FIG. 13 illustrates a cycle in which a metal silicate layer is formed according to example embodiments of the inventive concepts. FIG. 14(a) to (c) each illustrate a time period in which a reactant gas is supplied in each of the cycles in which a metal silicate layer is formed according to example embodiments of the inventive concepts.

As described above, a method of forming a metal silicate layer includes injecting a reactant gas. The reactant gas may have the properties of an oxidizing agent (e.g., ozone or oxygen). If the density and amount of the reactant gas that is to be supplied are increased, then impurities (e.g., carbon components) which are contained in the metal silicate layer are combined with the reactant gas and are thus removed. As such, the amount of the impurities in the metal silicate layer is reduced, thereby reducing the amount of leakage current. Further, if a sufficient (or substantial) amount of a reactant gas is supplied during the formation of the metal silicate layer, the reactivity of the reactant gas may increase, increasing the step coverage.

However, if a time period in which the reactant gas is supplied increases, a total deposition time also significantly increases, thereby increasing manufacturing costs. If an underlying layer below the metal silicate layer is a metal electrode layer, then the reactant gas reacts with the metal electrode layer when the amount of the reactant gas having the properties of an oxidizing agent increases, thereby causing an undesired oxide layer between the metal silicate layer and the metal electrode layer. If the metal silicate layer is a capacitor dielectric layer, the undesired oxide layer increases an effective oxide thickness (Toxeq) of the capacitor dielectric layer, thereby degrading the electrical performance of a capacitor.

The metal silicate layer may be formed according to an ALD process by repeatedly performing a unit cycle including the operations (or steps) included in the method of forming a silicate layer described above with reference to FIGS. 6 to 12.

Referring to FIG. 13, a total cycle in which the unit cycle is performed several times (e.g., ninety times) includes a former (or first) sub cycle in which the unit cycle is performed a first set (or desired) number of times and a latter (or second) sub cycle in which the unit cycle is performed a second set (or desired) number of times after the former (or first) sub cycle.

Referring to FIG. 14(a), during the total cycle, a time period in which a reactant gas is injected (the fifth time period t5 of FIG. 6 or the fifth time period s5 of FIG. 12) may be set to be, for example, thirty seconds.

Referring to FIG. 14(b), the total cycle includes a former (or first) sub cycle in which the unit cycle is performed, for example, twenty times and a latter (or second) sub cycle in which the unit cycle is performed after the former sub cycle. A time period in which the reactant gas is injected (the fifth time period t5 of FIG. 6 or the fifth time period s5 of FIG. 12) is set to, for example, two seconds in the former sub cycle and is set to be, for example, thirty seconds in the latter sub cycle. That is, the time period in which the reactant gas is supplied in the former sub cycle is shorter than in the latter sub cycle.

Referring to FIG. 14(c), the total cycle includes a former (or first) sub cycle in which the unit cycle is performed, for example, seventy times and a latter (or second) sub cycle in which the unit cycle is performed after the former sub cycle. A time period in which the reactant gas is injected (the fifth time period t5 of FIG. 6 or the fifth time period s5 of FIG. 12) is set to, for example, two seconds in the former sub cycle and is set to be, for example, thirty seconds in the latter sub cycle. That is, the time period in which the reactant gas is supplied in the former sub cycle is longer than in the latter sub cycle.

According to example embodiments of the inventive concepts, a metal silicate layer may be formed according to an ALD process by supplying a smaller amount of the reactant gas in a former sub cycle and supplying a greater amount of the reactant gas in the latter sub cycle.

Accordingly, oxidation of an underlying layer below the metal silicate layer may be prevented in the former sub cycle in order to control the generation of an oxidizing by-product. Impurities (e.g., carbon components) may be removed from a dielectric layer by supplying a sufficient amount of an oxidizing agent (reactant gas) in the latter sub cycle in order to remove leakage current. The ratio of materials to be contained in the metal silicate layer may be optimized (or selected) to increase a dielectric constant. A total deposition time required to form the metal silicate layer may be reduced by controlling a time period in which a reactant gas is supplied for each of the cycles.

Figure 15:
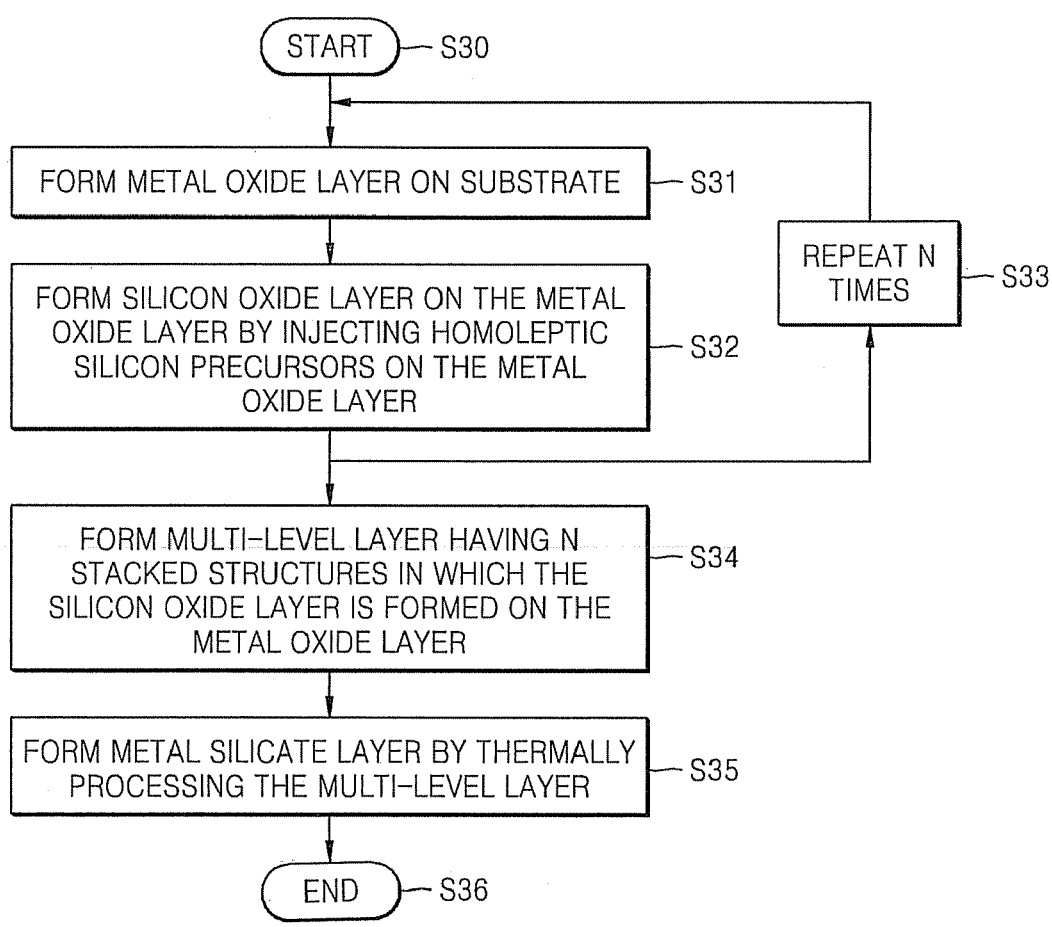
FIG. 15 is a flowchart illustrating a method of forming a metal silicate layer according to example embodiments of the inventive concepts.
Figure 16:
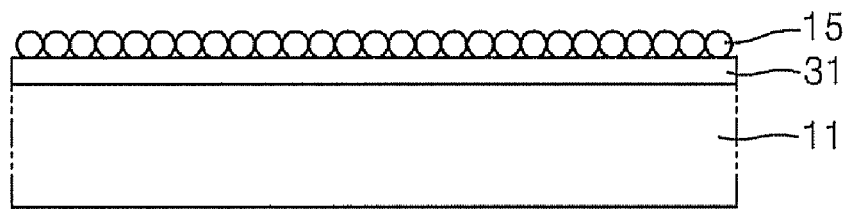
FIGS. 16 and 17 are cross-sectional views sequentially illustrating a method of forming a metal silicate layer according to example embodiments of the inventive concepts.
Figure 17:
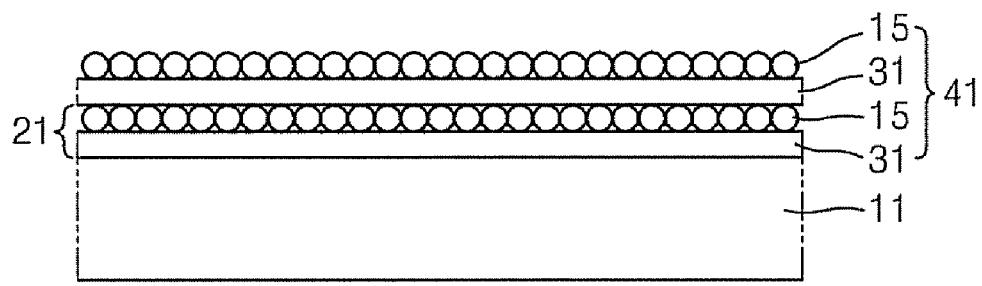

FIG. 15 is a flowchart illustrating a method of forming a metal silicate layer according to example embodiments of the inventive concepts. FIGS. 16 and 17 are cross-sectional views sequentially illustrating a method of forming a metal silicate layer according to example embodiments of the inventive concepts.

Referring to FIGS. 15 to 17, a metal oxide layer 31 is formed on a substrate 11 (S31). The metal oxide layer 31 may be formed according to a ALD process, in which a plurality of precursors (not shown) are injected on the substrate 11 to be adsorbed on the substrate 11, non-reacting precursors of the injected precursors are purged, a reactant gas is injected so that the absorbed precursors react with the reactant gas to form the metal oxide layer 31, and a non-reacting portion of the reactant gas and a by-product are purged.

For example, the metal oxide layer 31 may include a tantalum oxide ($Ta_2O_5$) layer, a hafnium oxide ($HfO_2$) layer, a zirconium oxide ($ZrO_2$) layer or an aluminum oxide ($Al_2O_3$) layer. In this case, the precursors may be formed of $Ta(OC_2H_5)_5$, $Hf[(C_2H_5)(CH_3)N]_4$, $Zr[(C_2H_5)(CH_3)N]_4$, and $Al(CH_3)_3$, respectively, but example embodiments of the inventive concepts are not limited thereto and various types of metal oxide layers and precursors may be used.

A plurality of homoleptic silicon precursors may be injected on the metal oxide layer 31 to form a silicon oxide layer 15 (S32).

The silicon oxide layer 15 may be formed according to a ALD process, in which a plurality of homoleptic silicon precursors (not shown) are injected on the metal oxide layer 31 to be adsorbed on the metal oxide layer 31, non-reacting homoleptic silicon precursors of the injected homoloeptic silicon precursors are purged, a reactant gas is injected so that the absorbed homoleptic silicon precursors react with the reactant gas to form the silicon oxide layer 15, and a non-reacting portion of the reactant gas and a by-product are purged.

The structure and type of the homoleptic silicon precursors have been described above with reference to FIGS. 1 to 5.

Because the same ligands are symmetrically bound to silicon in each of the homoleptic silicon precursors, the binding energies among silicon and the ligands are symmetrical with one another in a 3D space or on a 2D plane. The homoleptic silicon precursors are expected to be evenly adsorbed to, bound to, or separated from a surface of the substrate 11. As such, a silicon composition may be evenly distributed in a metal silicate layer which will be formed in a subsequent process.

Formation of the metal oxide layer on the substrate (S31) and formation of the silicon oxide layer by injected the homoleptic silicon precursors on the metal oxide layer (S32) are sequentially performed a number of times, n (S33). A multi-level layer 41 having n stacked structures 21 in which the silicon oxide layer 15 is formed on the metal oxide layer 31 is obtained (S34). Here, n is a positive integer. Although FIG. 17 illustrates a case where n is '2', it would be obvious to those of ordinary skill in the art that n may be other selected positive integers.

The multi-level layer 41 is thermally processed so that the metal oxide layer 31 reacts with the silicon oxide layer 15 to form the metal silicate layer (S35).

Figure 18:
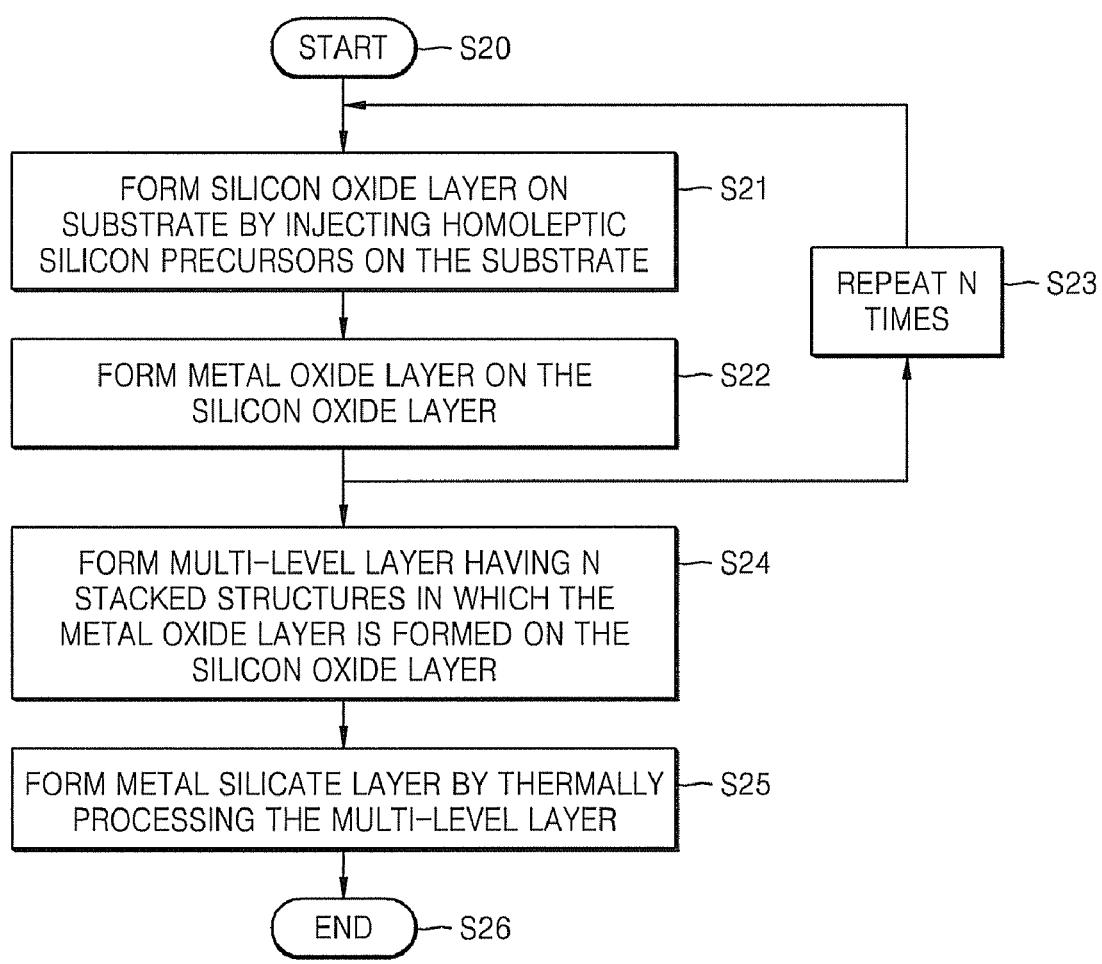
FIG. 18 is a flowchart illustrating a method of forming a metal silicate layer, according to example embodiments of the inventive concepts.
Figure 19:
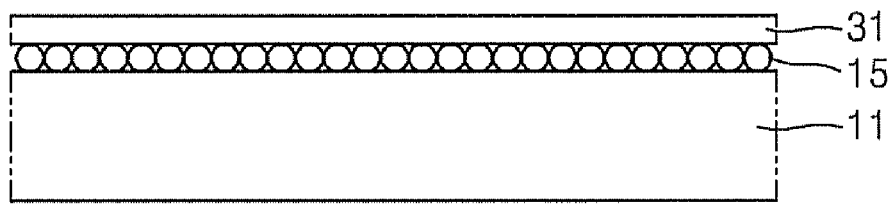
FIGS. 19 and 20 are cross-sectional views sequentially illustrating a method of forming a metal silicate layer according to example embodiments of the inventive concepts.
Figure 20:
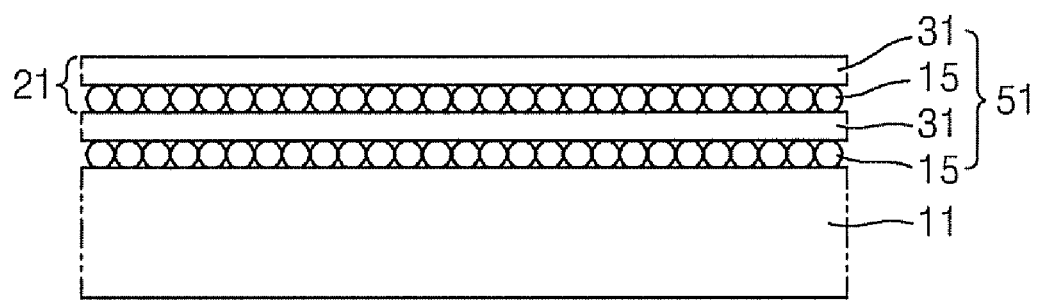

FIG. 18 is a flowchart illustrating a method of forming a metal silicate layer according to example embodiments of the inventive concepts. FIGS. 19 and 20 are cross-sectional views sequentially illustrating a method of forming a metal silicate layer according to example embodiments of the inventive concepts.

Referring to FIGS. 18 to 20, a plurality of homoleptic silicon precursors (not shown) are injected on a substrate 11 to form a silicon oxide layer 15 (S21).

The silicon oxide layer 15 may be formed according to a ALD process, in which a plurality of homoleptic silicon precursors (not shown) are injected on the substrate 11 to be adsorbed on the substrate 11, non-reacting homoleptic silicon precursors of the injected homoleptic silicon precursors are purged, a reactant gas is injected so that the homoleptic silicon precursors react with the reactant gas to form the silicon oxide layer 15, and a non-reacting portion of the reactant gas and a by-product are purged.

The structure and type of the homoleptic silicon precursors have been described above with reference to FIGS. 1 to 5.

Because the same ligands are symmetrically bound to silicon in each of the homoleptic silicon precursors, the binding energies among silicon and the ligands are symmetrical with one another in a 3D space or on a 2D plane. The homoleptic silicon precursors are expected to be evenly adsorbed to, bound to, or separated from a surface of the substrate 11 and/or a surface of an underlying layer. As such, a silicon composition may be evenly distributed in a metal silicate layer which will be formed in a subsequent process.

A metal oxide layer 31 may be formed on the silicon oxide layer 15 (S22).

The structure and type of the metal oxide layer 31 have been described above with reference to FIGS. 15 to 17.

Forming of the silicon oxide layer on the substrate by injecting the homoleptic silicon precursors on the substrate (S21) and forming the metal oxide layer on the silicon oxide layer (S22) are sequentially performed a number of times, n (S23). A multi-level layer 51 having n stacked structures 21 in which the metal oxide layer 31 is formed on the silicon oxide layer 15 is obtained (S24). Here, n is a positive integer. Although FIG. 20 illustrates a case where n is '2', it would be obvious to those of ordinary skill in the art that n may be other selected positive integers.

The multi-level layer 51 is thermally processed so that the metal oxide layer 31 reacts with the silicon oxide layer 15 to form the metal silicate layer (S35).

Figure 21:
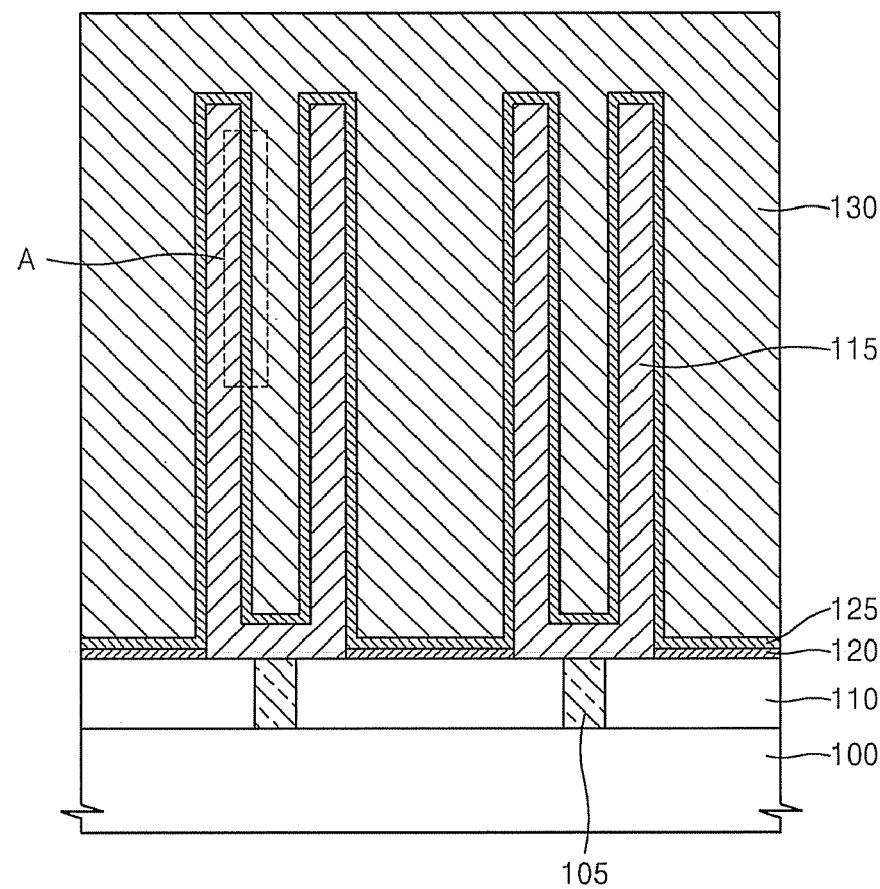
FIG. 21 is a cross-sectional view illustrating a method of forming a capacitor according to example embodiments of the inventive concepts.

FIG. 21 is a cross-sectional view illustrating a method of forming a capacitor according to example embodiments of the inventive concepts.

Referring to FIG. 21, an inter-level dielectric layer 110 having contact plugs 105 therein is formed on a semiconductor substrate 100. A circuit (not shown), (e.g., a MOS transistor), and a connection unit (not shown) may be formed between the semiconductor substrate 100 and the inter-level dielectric layer 110. The contact plugs 105 in the inter-level dielectric layer 110 may be formed of a conductive material layer (e.g., a TiN layer). The contact plugs 105 are formed to contact an electrode region of the MOS transistor or the connection unit that is electrically connected to the electrode region of the MOS transistor. A plurality of lower electrodes 115 are formed on the inter-level dielectric layer 110 to contact the contact plugs 105, respectively. The lower electrodes 115 may be formed to have a 3D shape (e.g., a concave or a cylindrical shape) so that a surface area thereof may be maximized. The lower electrodes 115 may be formed using a metal electrode, such as a metal nitride layer (e.g., a TiN layer), and a precious metal layer (e.g., a Ru or Pt layer) in order to prevent the capacitance of the capacitor from being reduced due to generation of a natural oxide layer. In this case, a surface of the inter-level dielectric layer 110 between the lower electrodes 115 may be covered with an etch stopper 120.

A dielectric layer 125 is formed on the lower electrode 115 and the etch stopper 120. The dielectric layer 125 may be formed using a metal silicate layer having a high dielectric constant and stable leakage current characteristics. For example, the metal silicate layer (not shown) may be formed of at least one selected from the group consisting of $Hf_xSi_{1-x}O_2$ and $Zr_ySi_{1-y}O_2$, where x and y denote real numbers greater than '0' and less than '1'. The metal silicate layer may be formed as described above with reference to FIGS. 1 to 20.

A conductive layer 130 is formed on the dielectric layer 125. The conductive layer 130 forms an upper electrode of the capacitor.

In general, the height of a capacitor is increased to increase a surface area thereof so that the capacitance of the capacitor may be increased. Good step coverage is required to form the dielectric layer 125. To this end, the dielectric layer 125 that is formed using the metal silicate layer may be formed according to a ALD process, and a method of forming a metal silicate layer according to example embodiments of the inventive concepts may be used in order to enhance step coverage.

Figure 22:
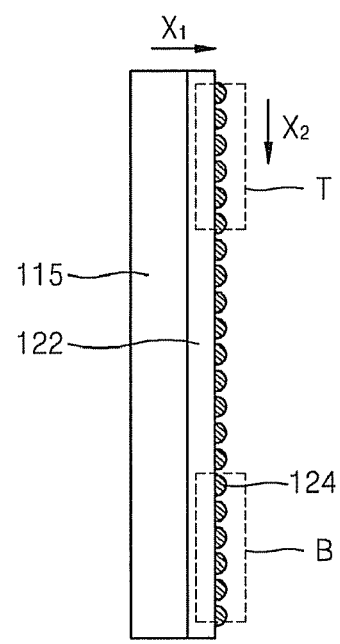
FIG. 22 is a cross-sectional view illustrating an operation included in a method of forming a dielectric layer for a capacitor by using a plurality of homoleptic silicon precursors according to example embodiments of the inventive concepts.
Figure 23:
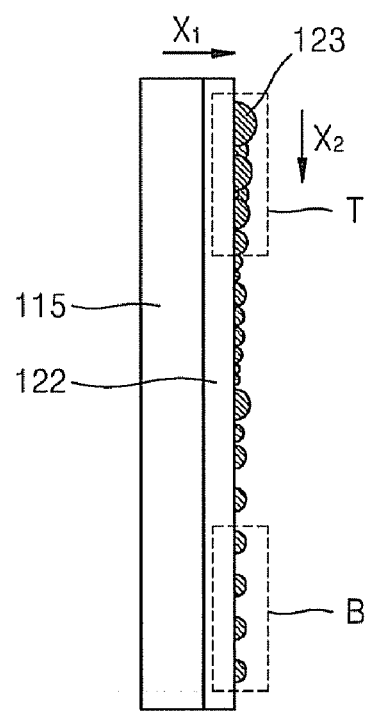
FIG. 23 is a cross-sectional view illustrating an operation included in a method of forming a dielectric layer for a capacitor by using a plurality of heteroleptic silicon precursors according to example embodiments of the inventive concepts.

FIG. 22 is a cross-sectional view illustrating an operation included in a method of forming a dielectric layer for a capacitor by using a plurality of homoleptic silicon precursors according to example embodiments of the inventive concepts. FIG. 23 is a cross-sectional view illustrating an operation included in a method of forming a dielectric layer for a capacitor by using a plurality of heteroleptic silicon precursors according to example embodiments of the inventive concepts.

FIGS. 22 and 23 are cross-sectional views illustrating an enlargement of region A of FIG. 21, marked by a dotted line.

Referring to FIGS. 21 and 22, a metal oxide layer 122 is formed on the lower electrode 115. A plurality of homoleptic silicon precursors (not shown) are injected on the metal oxide layer 122. Homoleptic silicon precursors 124 are adsorbed on the metal oxide layer 122 from among the injected homoleptic silicon precursors.

The structure and type of the homoleptic silicon precursors have been described above with reference to FIGS. 1 to 5.

The homoleptic silicon precursors are injected in a direction X1 parallel to a main plane of the semiconductor substrate 100, and are diffused along in a direction X2 perpendicular to the main plane of the semiconductor substrate 100 to be adsorbed on the metal oxide layer 122.

Because the same ligands are bound to silicon (or may be symmetrically bound to silicon) in the each of the homoleptic silicon precursors 124, the binding energies among silicon and the ligands are symmetrical with one another in a 3D space or on a 2D plane. The homoleptic silicon precursors are expected to be evenly adsorbed to, bound to, or separated from a surface of the metal oxide layer 122 along the perpendicular direction X2 (from an upper region T to a lower region B of the capacitor). As such, a silicon composition may be evenly distributed in a metal silicate layer which will be formed in a subsequent process.

The metal oxide layer 122 reacts with the adsorbed silicon precursors 124 in a subsequent process (when a reactant gas is supplied and/or when thermal processing is performed) to form the dielectric layer 125 of FIG. 21, which is formed of a metal silicate layer.

Figure 24:
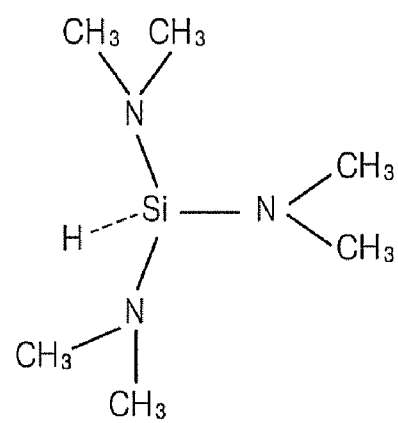
FIG. 24 is an illustration of the molecular structure of a heteroleptic silicon precursor according to example embodiments of the inventive concepts.

FIG. 24 illustrates the molecular structure of a heteroleptic silicon precursor 3-DMASiH according to example embodiments of the inventive concepts.

Referring to FIG. 24, ligands bound to silicon in each of the heteroleptic silicon precursor 3-DMASiH are not the same. Thus, binding energies among the silicon and the ligands are not symmetrical with one another in a 3D space. In detail, a binding energy between silicon and nitrogen is 470 kJ/mol and a binding energy between silicon and hydrogen is 299 kJ/mol. As such, the hydrogen is relatively easily separated from the silicon.

Referring to FIG. 23, heteroleptic silicon precursors 123 are unevenly adsorbed to, bound to, or separated from a surface of a metal oxide layer 122 in the perpendicular direction X2 (from an upper region T and a lower region B of a capacitor) because the heteroleptic silicon precursor 3-DMASiH, adsorption, binding, or separation occurs selectively in a 3D space. As such, a silicon composition is unevenly distributed in a metal silicate layer that will be formed in a subsequent process.

Figure 25:
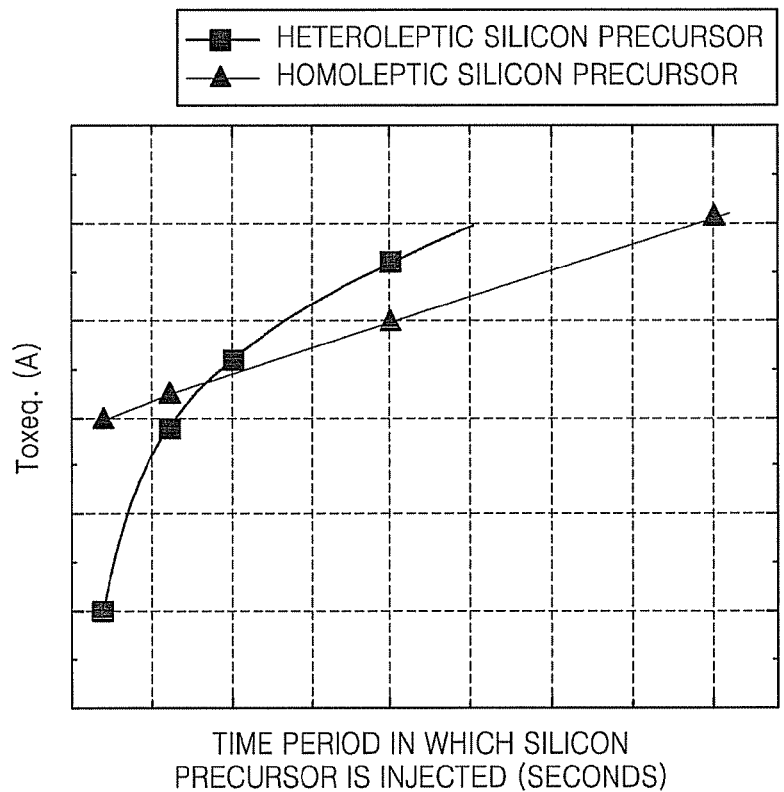
FIG. 25 is a graph comparing an effective oxide thickness of a capacitor dielectric layer when a plurality of homoleptic silicon precursors are used according to example embodiments of the inventive concepts and when a plurality of heteroleptic silicon precursors are used.

FIG. 25 is a graph comparing an effective oxide thickness (Toxeq) of a capacitor dielectric layer when a plurality of homoleptic silicon precursors are used according to example embodiments of the inventive concepts and when a plurality of heteroleptic silicon precursors are used.

Referring to FIG. 25, when a dielectric layer including a metal silicate layer formed by using a plurality of heteroleptic silicon precursors is used, the effective oxide thickness (Toxeq) of the capacitor dielectric layer increases rapidly as a time period in which the plurality of heteroleptic silicon precursors are injected increases, thereby degrading the electric characteristics of the capacitor.

In contrast, when a dielectric layer including a metal silicate layer formed by using a plurality of homoleptic silicon precursors is used, the effective oxide thickness (Toxeq) of the capacitor dielectric layer increases slowly as a time period in which the plurality of heteroleptic silicon precursors are injected increases, thereby increasing the electric characteristics of the capacitor.

It is determined that this difference is caused by the difference between the degrees of adsorption of the homoleptic silicon precursors as illustrated in FIG. 22 and the heteroleptic silicon precursors as illustrated in FIG. 23. That is, the difference in absorption is due to the heteroleptic silicon precursors being unevenly adsorbed to the upper and lower regions T and B of the capacitor; whereas the homoleptic silicon precursors are evenly adsorbed to the upper and lower regions T and B of the capacitor.

Figure 26:
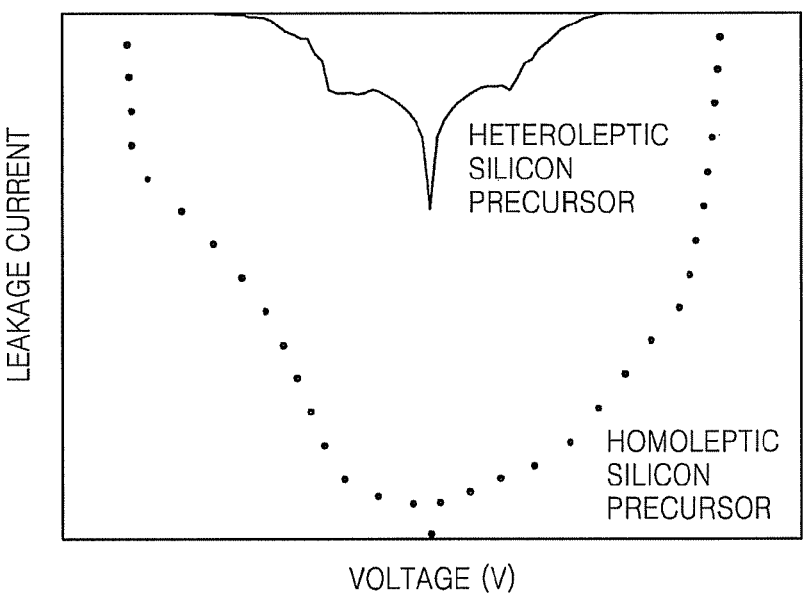
FIG. 26 is a graph comparing an amount of leakage current of a capacitor dielectric layer when a plurality of homoleptic silicon precursors are used according to example embodiments of the inventive concepts and when a plurality of heteroleptic silicon precursors are used.

FIG. 26 is a graph comparing an amount of leakage current of a capacitor dielectric layer when a plurality of homoleptic silicon precursors are used according to example embodiments of the inventive concepts and when a plurality of heteroleptic silicon precursors are used.

Referring to FIG. 26, when a dielectric layer having a metal silicate layer formed using a plurality of heteroleptic silicon precursors is used, the amount of leakage current of the capacitor dielectric layer is relatively large.

In contrast, when a dielectric layer having a metal silicate layer formed using a plurality of homoleptic silicon precursors is used, the amount of leakage current of the capacitor dielectric layer is relatively small, thereby increasing the electrical characteristics of a capacitor.

It is determined that the difference in leakage current is caused by the difference between the degrees of adsorption of the homoleptic silicon precursors as illustrated in FIG. 22 and the heteroleptic silicon precursors as illustrated in FIG. 23. That is, the difference in leakage current is due to the heteroleptic silicon precursors being unevenly adsorbed to the upper and lower regions T and B of the capacitor; whereas the homoleptic silicon precursors are evenly adsorbed to the upper and lower regions T and B.

Figure 27:
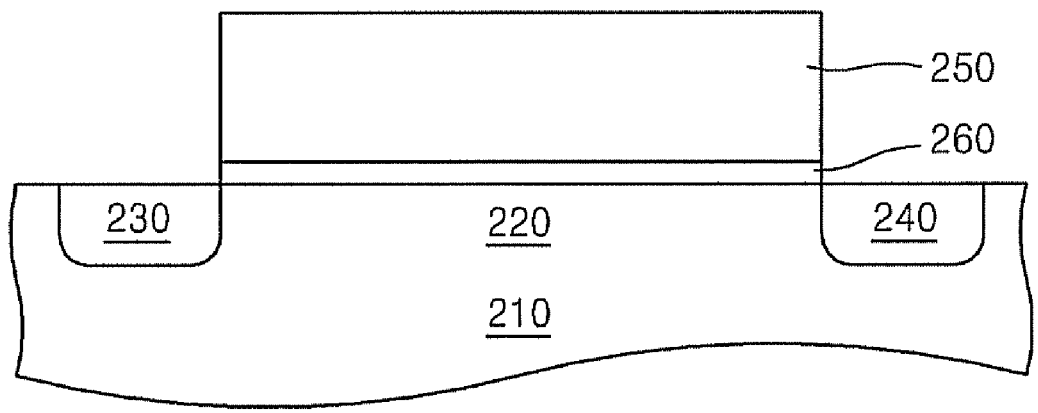
FIG. 27 is a cross-sectional view illustrating a method of forming a gate for a transistor according to example embodiments of the inventive concepts.

FIG. 27 is a cross-sectional view illustrating a method of forming a gate for a transistor according to example embodiments of the inventive concepts.

FIG. 27 illustrates a cross-section of field-effect transistor as an example of the transistor. The transistor includes a silicon substrate 210 doped with a high density of p-type impurities. The silicon substrate 210 includes an n-type impurity-doped source 230, an n-type impurity-doped drain 240, and a channel region 220 between the n-type impurity-doped source 230 and the n-type impurity-doped drain 240. A gate dielectric layer 260 is formed on the channel region 220. A gate electrode 250 formed of a conductive layer is formed on the gate dielectric layer 260 and is isolated from the channel region 220 via the gate dielectric layer 260 formed between the gate electrode 250 and the channel region 220. The gate dielectric layer 260 may be a metal silicate layer having a high dielectric constant and stable leakage current characteristics. For example, the metal silicate layer may be formed of at least one selected from the group consisting of $Hf_xSi_{1-x}O_2$ and $Zr_ySi_{1-y}O_2$, where x and y denote real numbers greater than '0' and less than '1' and may be formed as described above with reference to FIGS. 1 to 20.

Figure 28:
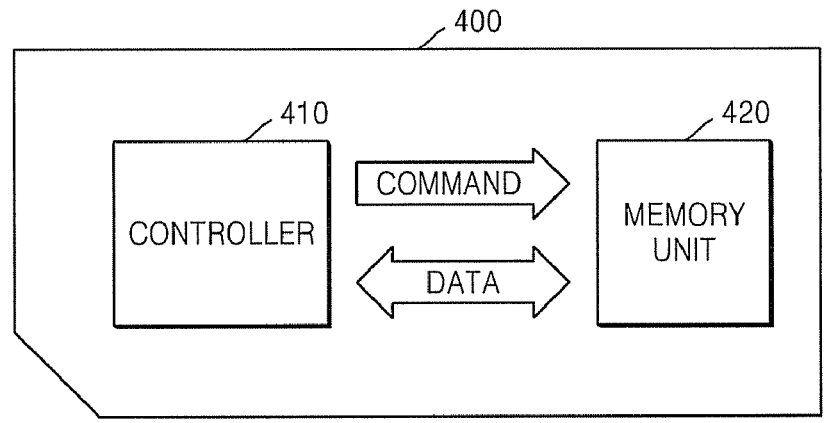
FIG. 28 is a schematic diagram of a card according to example embodiments of the inventive concepts.

FIG. 28 is a schematic diagram of a card 400 according to embodiments of the inventive concepts.

Referring to FIG. 28, a controller 410 and a memory 420 may be disposed to exchange an electrical signal with each other. For example, the memory 420 and the controller 410 may exchange data with each other according to a command provided from the controller 410. The card 400 may store data in or read data from the memory 420.

The memory 420 may include a memory device using a metal silicate layer as described above with reference to FIGS. 1 to 27. Here, the types of the memory device is not limited and the memory device may be dynamic random access memory (DRAM), synchronous random access memory (SRAM), flash memory or phase change RAM (PRAM).

The card 400 may be employed in various types of portable electronic devices (e.g., a multi media card (MMC) or a secure digital (SD) card).

Figure 29:
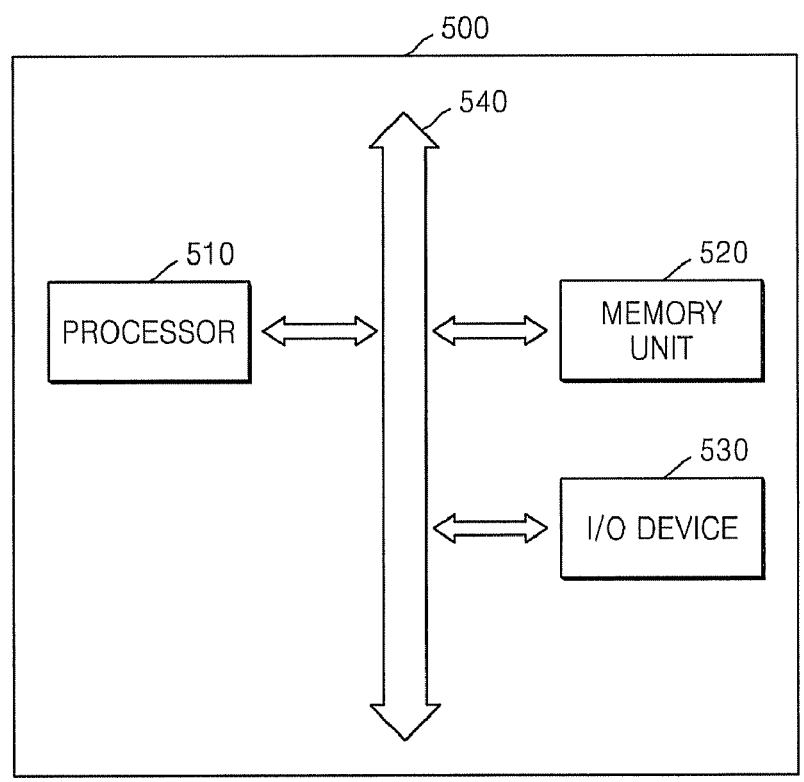
FIG. 29 is a schematic diagram of a system according to example embodiments of the inventive concepts.

FIG. 29 is a schematic diagram of a system 500 according to example embodiments of the inventive concepts.

Referring to FIG. 29, a processor 510, an input/output (I/O) device 530, and a memory 520 may establish a data communication with one another via a bus 540. The processor 510 may execute a program and control the system 500. The I/O device 530 may be used to input data to or output data from the system 500. The system 500 may be connected to an external device (e.g., a personal computer (PC) or a network) via the I/O device 530 to exchange data with the external device.

The memory 520 may store code and data for operating the processor 510. The memory 520 may include a memory device using a metal silicate layer as described with reference to FIGS. 1 to 27. Here, the types of the memory device is not limited and the memory device may be dynamic random access memory (DRAM), synchronous random access memory (SRAM), flash memory or phase change RAM (PRAM).

For example, the system 500 may be employed in various types of portable electronic devices (e.g., a mobile phone, an MP3 player, a navigation device, a solid state disk (SSD) or household appliances).

While the inventive concepts have been particularly shown and described with reference to example embodiments thereof, it will be understood that various changes in form and details may be made therein without departing from the spirit and scope of the following claims.

What is claimed is:

1. A method of forming a metal silicate layer, comprising:
   forming the metal silicate layer using a plurality of metal precursors and a plurality of homoleptic silicon precursors,
   wherein ligands bound to silicon in each of the plurality of homoleptic silicon precursors have the same molecular structure,
   the plurality of metal precursors and the plurality of homoleptic silicon precursors are not supplied at a same time,
   remnants of the supplied plurality of metal precursors and homoleptic silicon precursors that have not adsorbed or reacted with an underlying layer of a different composition are purged so as to leave behind a conformal layer on the underlying layer,
   forming the metal silicate layer includes injecting a reactant gas so that the adsorbed homoleptic silicon precursors, the absorbed metal precursors, and the reactant gas react with one another to form the metal silicate layer,
   the reactant gas is injected in a total cycle consisting of a first cycle and a second cycle performed after the first cycle, a period of time for the first cycle being shorter than that for the second cycle, and
   the first and second cycles each include sequentially supplying the plurality of homoleptic silicon precursors, purging, supplying the plurality of metal precursors, purging, supplying the reactant gas and purging.

2. The method of claim 1, wherein the ligands in each of the plurality of homoleptic silicon precursors are symmetrically bound to the silicon.

3. The method of claim 1, wherein the plurality of homoleptic silicon precursors are $Si(OC_2H_5)_4$.

4. The method of claim 1, wherein the plurality of homoleptic silicon precursors are $Si(NCO)_4$.

5. The method of claim 1, wherein the plurality of homoleptic silicon precursors are $SiCl_4$.

6. The method of claim 1, wherein the plurality of homoleptic silicon precursors are $Si[N(CH_3)_2]_4$.

7. The method of claim 1, wherein the plurality of homoleptic silicon precursors include silicon and carbon.

8. The method of claim 1, wherein the plurality of homoleptic silicon precursors include silicon, carbon and hydrogen.

9. The method of claim 1, wherein the plurality of homoleptic silicon precursors include silicon, carbon and nitrogen.

10. The method of claim 1, wherein forming the metal silicate layer includes performing an atomic layer deposition process, the atomic layer deposition process including,
    forming a silicon oxide layer on a substrate by injecting the plurality of homoleptic silicon precursors on the substrate,
    forming a metal oxide layer on the silicon oxide layer,
    forming a multi-level layer on the substrate by performing the forming of the silicon oxide layer and the forming of the metal oxide layer a number of times, n, wherein the multi-level layer includes n stacked structures in which the metal oxide layer is formed on the silicon oxide layer, and n is a positive integer, and
    forming the metal silicate layer by thermally processing the multi-level layer.

11. The method of claim 1, wherein forming the metal silicate layer includes performing an atomic layer deposition process, the atomic layer deposition process including,
    forming a metal oxide layer on a substrate,
    forming a silicon oxide layer on the metal oxide layer by injecting the plurality of homoleptic silicon precursors on the metal oxide layer,
    forming a multi-level layer on the substrate by performing the forming of the metal oxide layer and the forming of the silicon oxide layer a number of times, n, wherein the multi-level layer includes n stacked structures in which the silicon oxide layer is formed on the metal oxide layer, and n is a positive integer, and
    forming the metal silicate layer by thermally processing the multi-level layer.

12. The method of claim 1, wherein forming the metal silicate layer includes performing an atomic layer deposition process, the atomic layer deposition process including, injecting the plurality of metal precursors on a substrate so that some of the injected metal precursors are adsorbed on the substrate, and purging a plurality of remnant metal precursors that are not adsorbed on the substrate, the remnant metal precursors being from among the injected metal precursors, performing the injecting of the plurality of metal precursors on the substrate and the purging of the remnant metal precursors that are not adsorbed on the substrate a number of times, n, where n is a positive integer, injecting the plurality of homoleptic silicon precursors on the adsorbed metal precursors so that some of the injected homoleptic silicon precursors are adsorbed on the adsorbed metal precursors, and purging a plurality of remnant homoleptic silicon precursors that are not adsorbed to the adsorbed metal precursors, the remnant homoleptic silicon precursors being from among the injected homoleptic silicon precursors, performing the injecting of the homoleptic silicon precursors on the adsorbed metal precursors and the purging of the remnant homoleptic silicon precursors that are not adsorbed to the adsorbed metal precursors a number of times m, where m is a positive integer, the injecting of the reactant gas, and purging a non-reacting portion of the injected reactant gas.

13. The method of claim 12, wherein the atomic layer deposition process is performed a number of times, y, where y is a positive integer equal to and greater than '2'.

14. The method of claim 13, wherein
the first cycle is performed a number of times, k, where k is a positive integer less than y.

15. The method of claim 1, wherein forming the metal silicate layer includes performing an atomic layer deposition process, the atomic layer deposition process including, injecting the plurality of homoleptic silicon precursors on a substrate so that some of the injected homoleptic silicon precursors are adsorbed on the substrate, and purging a plurality of remnant homoleptic silicon precursors that are not adsorbed on the substrate, the remnant homoleptic silicon precursors being from among the injected homoleptic silicon precursors, performing the injecting of the homoleptic silicon precursors on the substrate and the purging of the remnant homoleptic silicon precursors that are not adsorbed on the substrate a number of times, n, where n is a positive integer, injecting the plurality of metal precursors on the adsorbed homoleptic silicon precursors so that some of the injected metal precursors are adsorbed on the adsorbed homoleptic silicon precursors, and purging a plurality of remnant metal precursors that are not adsorbed on the plurality of homoleptic silicon precursors, the remnant metal precursors being from among the injected metal precursors, performing the injecting of the metal precursors on the adsorbed homoleptic silicon precursors and the purging of the remnant metal precursors that are not adsorbed on the homoleptic silicon precursors a number of times, m, where m is a positive integer, the injecting of the reactant gas, and purging a non-reacting portion of the reactant gas.

16. The method of claim 1, wherein a metal included in the metal silicate layer may be at least one selected from the group consisting of a quadrivalent metal, a trivalent metal, a divalent metal, a pentavalent metal, rare earth elements and mixtures thereof.

17. A method of fabricating a semiconductor device, the method comprising:
forming the metal silicate layer according to claim 1; an
forming a conductive layer on the metal silicate layer,
wherein the metal silicate layer is a dielectric of a gate of a transistor.

18. A method of fabricating a semiconductor device, the method comprising:
forming the metal silicate layer according to claim 1; and
forming a conductive layer on the metal silicate layer,
wherein the metal silicate layer is a dielectric of a capacitor.

19. The method of claim 18, wherein the metal silicate layer is formed on a lower electrode of the capacitor, and
the conductive layer forms an upper electrode of the capacitor.

20. The method of claim 17, wherein the metal silicate layer is at least one selected from the group consisting of $Hf_xSi_{1-x}O_2$ and $Zr_ySi_{1-y}O_2$, where x and y are real numbers greater than '0' and less than '1'.

21. The method of claim 1, wherein at least one of the plurality of metal precursors and the plurality of homoleptic silicon precursors are supplied to a substrate from a point below the substrate.

22. The method of claim 21, wherein at least one of the plurality of metal precursors and the plurality of homoleptic silicon precursors are supplied to the substrate in a first direction, the first direction being perpendicular to a main surface of the substrate.

* * * * *